(12) United States Patent
Yumoto

(10) Patent No.: US 6,404,683 B1
(45) Date of Patent: Jun. 11, 2002

(54) NONVOLATILE SEMICONDUCTOR MEMORY DEVICE AND TEST METHOD WITH MEMORY-ASSISTED ROLL CALL

(75) Inventor: Naotaka Yumoto, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/848,765

(22) Filed: May 4, 2001

(30) Foreign Application Priority Data

Sep. 12, 2000 (JP) ........................................ 2000-276209

(51) Int. Cl.[7] ................................................. G11C 7/00
(52) U.S. Cl. .................... 365/200; 365/201; 365/185.09
(58) Field of Search ................................ 365/200, 201, 365/185.09, 185.22, 189.07

(56) References Cited

U.S. PATENT DOCUMENTS 5,523,974 A * 6/1996 Hirano et al. ................ 365/200
5,617,364 A * 4/1997 Hatakayama ................ 365/200
5,737,269 A * 4/1998 Fujita .......................... 365/200

* cited by examiner

Primary Examiner—Tan T. Nguyen
(74) Attorney, Agent, or Firm—Rabin & Berdo, P.C.

(57) ABSTRACT

A semiconductor memory device has a main cell array, a redundant cell array, a spare cell array, and a selection circuit. The selection circuit can be programmed with the addresses of defective memory cells in the main cell array, and can then select memory cells in the redundant cell array in place of the defective memory cells. The addresses programmed into the selection circuit are also stored in the spare cell array. After programming of the selection circuit, the programmed addresses are read from the selection circuit and compared with the addresses stored in the spare cell array to verify that the programming has been accomplished successfully.

8 Claims, 10 Drawing Sheets

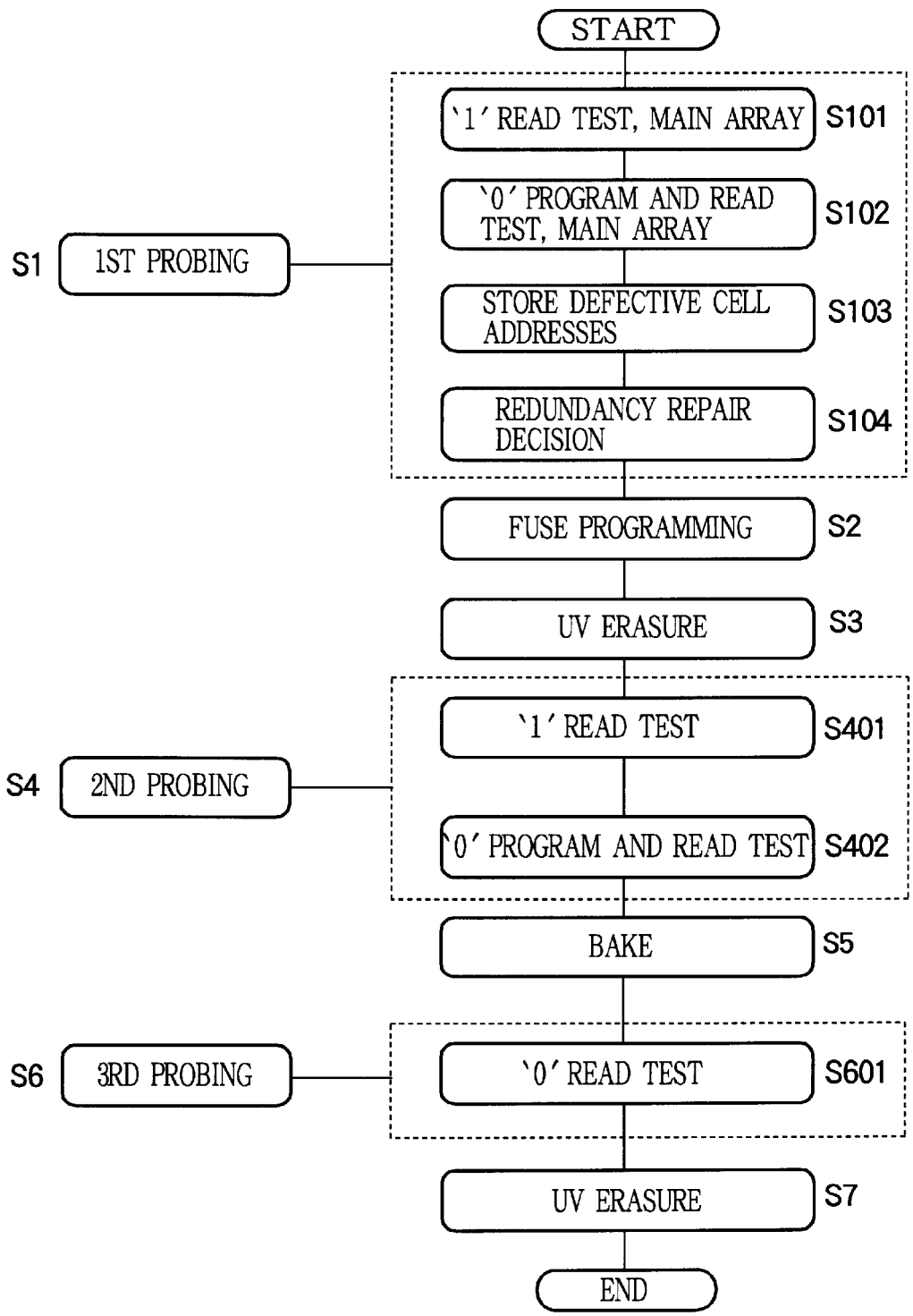

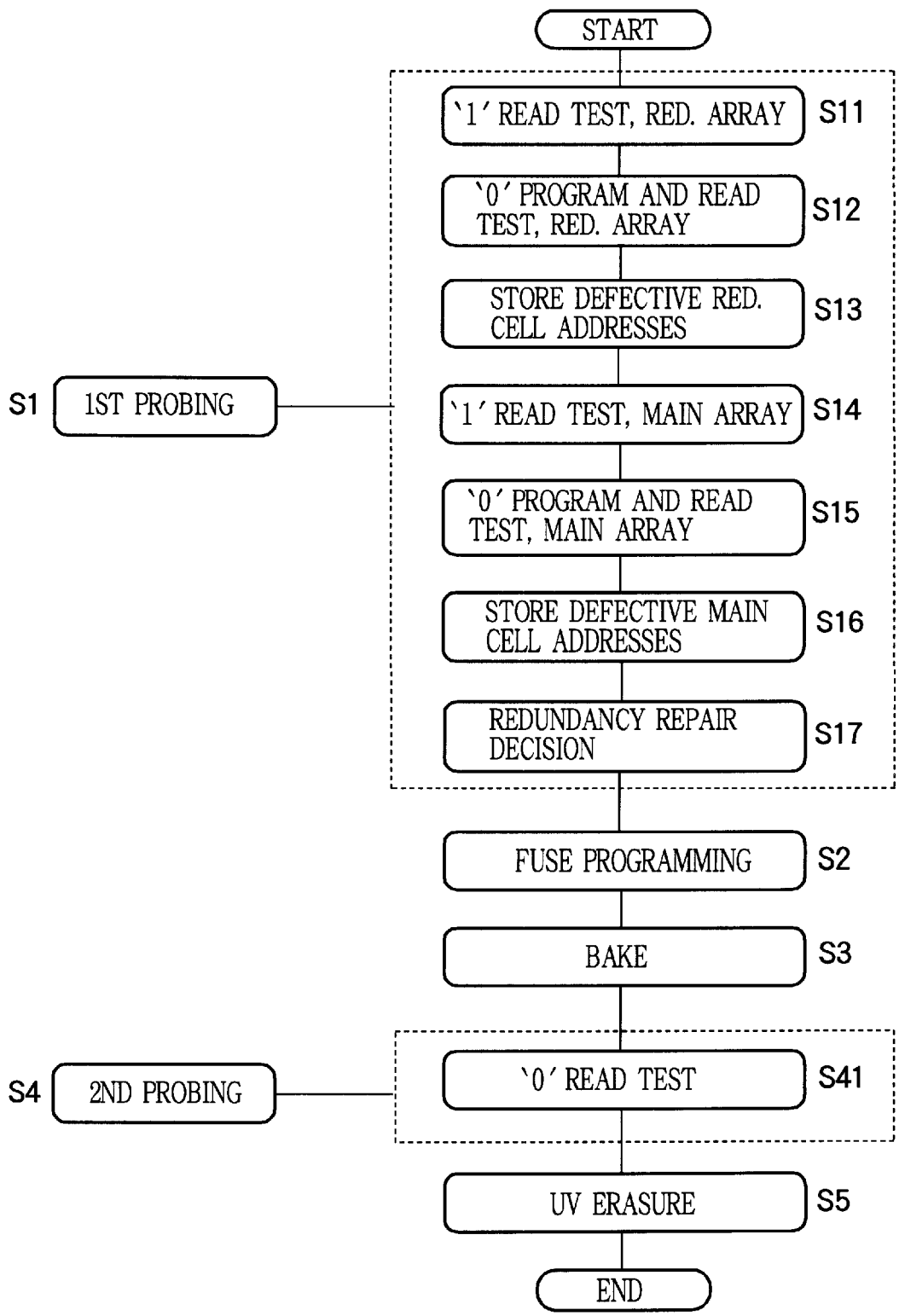

NONVOLATILE SEMICONDUCTOR MEMORY DEVICE AND TEST METHOD WITH MEMORY-ASSISTED ROLL CALL

BACKGROUND OF THE INVENTION

The present invention relates to a semiconductor memory device such as an electrically programmable nonvolatile memory with redundant memory cells for replacement of defective memory cells, and to the testing of such a semiconductor memory device.

There are various types of electrically programmable nonvolatile memory, including one-time programmable (OTP) read-only memory (ROM), which can be programmed but not erased; erasable programmable read-only memory (EPROM), which can be erased by exposure to ultraviolet light; and electrically erasable programmable read-only memory (EEPROM), which can be both programmed and erased electrically. An OTP ROM and an EPROM may be structurally the same, but the EPROM is housed in a package that admits ultraviolet light, while the OTP ROM is housed in a package that does not admit ultraviolet light. In this case, the data in an OTP ROM are erasable at the factory, before the device is packaged, but cannot be erased once the device has been shipped as a product. An OTP ROM is typically enclosed in an inexpensive plastic package, while an EPROM requires a more expensive windowed ceramic package.

Incidentally, OTP ROM is sometimes referred to by various other names, such as PROM (programmable ROM).

FIG. 8 shows a block diagram of a conventional OTP ROM or EPROM device. The device comprises a main cell array 10, an address buffer (AD. BUF.) 11, a plurality of address input terminals 12, a row decoder (DEC.) 13, a plurality of word lines 14, a column (COL.) decoder 15, a column switch circuit 16, a plurality of bit lines 17, a data input-output circuit 18, at least one data input-output terminal 19, a control circuit 20, a plurality of control signal input terminals 21, a redundancy fuse circuit (CKT) 22, a redundant address buffer (RED. AD. BUF.) 23, a redundancy decoder (RED. DEC.) 24, at least one redundant word line 25, a redundant cell array 26, and a non-select signal line 27.

The main cell array 10 and redundant cell array 26 are arrays of nonvolatile memory cells. Each memory cell comprises, for example, a field-effect transistor with a floating gate. The cell is programmed to the '0' state by injection of electrons into the floating gate, and erased to the '1' state by removal of electrons from the floating gate; these operations change the threshold voltage of the transistor. The programming operation is carried out by applying predetermined voltages to the memory cell; the erasing operation is carried out by exposure to ultraviolet light.

A memory cell is selected for programming or read access by selecting the bit line 17 and the word line 14 or redundant word line 25 to which the cell is connected. Only one word line 14 or redundant word line 25 is selected at a time, but when bit lines 17 are selected, n bit lines are selected simultaneously, where n is the number of data input-output terminals 19. Programming and read access are thus carried out n bits at a time; n is referred to as the data width.

The nonvolatile memory cells in the main cell array 10 will be referred to below as main memory cells, or simply as main cells. The nonvolatile memory cells in the redundant cell array 26 will be referred to as redundant memory cells, or simply as redundant cells.

The address signals received at the address input terminals 12 include a row address and a column address. Both the row and column addresses are stored simultaneously in the address buffer 11. Normally, the row decoder 13 decodes the row address and thereby selects one of the word lines 14. The column decoder 15 decodes the column address and supplies decoded signals to the column switch circuit 16, which selects a corresponding group of n bit lines 17. In this way n main memory cells are selected.

When data are programmed into the selected memory cells, n bits of data are supplied to the data input-output terminals 19 and passed in parallel through the data input-output circuit 18 to a programming circuit (not visible) in the column switch circuit 16, which places the data on the n selected bit lines 17. The data are programmed by the application of suitable voltages to the selected word line 14 and bit lines 17.

When data are read from the selected memory cells, n bits of data are passed in parallel from the memory cells through the column switch circuit 16 to sense amplifiers (not visible) in the data input-output circuit 18, then output from the data input-output terminals 19.

A word line 14 having one or more defective memory cells is replaced with a redundant word line 25 by cutting corresponding fuses (not visible) in the redundancy fuse circuit 22, thereby programming the redundancy fuse circuit 22 with the row address of the word line. This process is referred to as redundancy repair, and the row addresses programmed into the redundancy fuse circuit 22 will be referred to as redundancy repair addresses. After redundancy repair, when an address is received at the address input terminals 12 and stored in the address buffer 11, if the row address bits do not match any redundancy repair address, the row address is decoded by the row decoder 13 as described above to select a word line 14, but if the row address bits match a redundancy repair address, the redundancy decoder 24 drives the non-select signal line 27, thereby disables the row decoder 13, and selects a redundant word line 25. As a result, n redundant memory cells on the selected redundant word line 25 are accessed (programmed or read).

Before redundancy repair is performed, the redundant cell array 26 may need to be tested to check that the redundant cells themselves are not defective. During this test procedure, the control circuit 20 controls the redundancy decoder 24 to select the redundant word lines 25.

FIG. 9 is a flowchart of a conventional procedure for testing the memory cells and performing redundancy repair. The test procedure is carried out on a wafer on which a plurality of nonvolatile memory devices have been formed. The test apparatus, referred to below as a tester, has electrodes for accessing ('probing') the address input terminals 12, data input-output terminals 19, and control signal input terminals 21 of each memory device on the wafer. The procedure comprises a first probing step S1, a fuse-programming step S2, an ultraviolet (UV) erasing step S3, a second probing step S4, a wafer baking step S5, a third probing step S6, and another ultraviolet erasing step S7. The first probing step S1 includes sub-steps S101 to S104. The second probing step S4 includes sub-steps S401 and S402. The third probing step S6 includes a single sub-step S601.

At the beginning of the procedure all memory cells are nominally in the erased ('1') state.

The first probing step S1 is carried out as follows. In sub-step S101, all memory cells in the main cell array 10 are read to check that they are in the '1' state. This is referred to as a '1' read test (a read test with the expected value '1'). Next, in sub-step S102, all memory cells in the main cell array 10 are programmed to the '0' state and a '0' read test is performed (a read test with the expected value '0'). The redundant memory cells are not tested at this stage.

Next, in sub-step S103, the row addresses of any defective main memory cells found in the preceding sub-steps are stored in the tester. Then in sub-step S104, the tester decides whether redundancy repair is necessary, and if necessary, whether it is feasible; that is, whether there are enough redundant word lines 25 to replace all the word lines 14 having defective memory cells.

If redundancy repair is necessary and feasible, then the redundancy fuse circuit 22 is programmed in step S2 by cutting fuses corresponding to the row addresses of the defective memory cells. This step replaces the defective main memory cells with redundant memory cells.

Following these steps, the wafer is exposed to ultraviolet light in step S3, erasing all memory cells to the '1' state.

In the second probing step S4, a '1' read test is performed in sub-step S401. All memory addresses are read. If any main memory cells have been replaced with redundant memory cells, then the redundant memory cells are read in place of the main memory cells. If the device passes this test, then '0' data are programmed at all memory addresses and a '0' read test is performed in sub-step S402.

At the end of step S2, four types of faults may be present in the device: (1) a main memory cell that cannot be erased to '1' (is stuck at '0') and has not been replaced by a redundant memory cell, possibly because the cell was not detected by the '1' read test in the first probing step, but more often because of unsuccessful fuse programming; (2) a main memory cell that cannot be programmed to '0' (is stuck at '1') and has not been replaced by a redundant memory cell, usually because of unsuccessful fuse programming; (3) a main memory cell replaced by a redundant memory cell that cannot be erased to '1;' (4) a main memory cell replaced by a redundant memory cell that cannot be programmed to '0.'

Substantially all of these errors are detected by the '1' read test and '0' read test performed in the second probing step S4. Devices that pass these two tests are programmed to '0' at all memory addresses.

After the baking process in step S5, the third probing step S6 is carried out. The purpose of this probing step is to detect data retention faults. If, as explained above, a nonvolatile memory cell is programmed to '0' by injecting electrons into its floating gate, a data retention fault may occur due to slow leakage of the electrons from the floating gate. Baking accelerates the leakage process, so that data retention faults can be found more easily.

The third probing step S6 consists of a '0' read test (sub-step S601) performed at all memory addresses. Devices that fail this test, or fail either of the tests in the second probing step S4, or have too many bad main memory cells to be repaired, are marked as defective.

In step S7, the wafer is exposed to ultraviolet light to erase all data to '1' again, after which the wafer proceeds to further processing.

The procedure in FIG. 9 requires three separate wafer probing steps: one (S1) to identify the need for and feasibility of redundancy repair, another (S4) to detect faults of types (1) to (4) above, and yet another (S6) to detect data retention faults.

Unfortunately, wafer probing is relatively expensive. The problem is that fewer memory devices can be tested simultaneously during wafer probing than after the devices have been separated and packaged, and each wafer probing process takes time, because all addresses must be accessed. The total cost of three wafer probing steps contributes significantly to the unit cost of the memory device, especially when the device is an inexpensive OTP ROM.

FIG. 10 shows another conventional testing procedure that reduces the number of wafer probing steps from three to two. The procedure includes a first probing step S1, a fuse-programming step S2, a baking step S3, a second probing step S4, and an ultraviolet erasing step S5. The first probing step S1 includes sub-steps S11 to S17. The second probing step S4 includes a single sub-step S41.

The first probing step S1 begins with a '1' read test of all redundant (RED.) memory cells (sub-step S11). Next, all redundant memory cells are programmed to '0,' and a '0' read test is performed on them (sub-step S12). The addresses of any defective redundant cells found in these tests are stored in the tester (sub-step S13).

The first probing step continues with a '1' read test of all main memory cells (sub-step S14). Next, all main memory cells are programmed to '0,' and a '0' read test is performed on them (sub-step S15). The addresses of any defective main cells found in these tests are stored in the tester (sub-step S16).

From the stored addresses of the defective memory cells, the tester decides whether all of the defective main cells can be replaced with non-defective redundant cells (sub-step S17). This completes the first probing step.

If redundancy repair is necessary and feasible, the redundancy fuse circuit 22 is programmed by cutting fuses in step S2. By programming the row addresses of the defective main memory cells into the redundancy fuse circuit 22, this step replaces the defective main memory cells with non-defective redundant memory cells. At the end of this step, since all memory cells were programmed to '0' in sub-steps S12 and S15 of the first probing step S1, all-zero data should be readable from all addresses.

In step S3, the wafer is baked to accelerate leakage of programmed data from faulty memory cells.

In the second probing step S4, data retention is tested by performing a '0' read test (sub-step S41).

Finally, the wafer is exposed to ultraviolet light to erase all data to '1' in step S5.

Of the various types of faults mentioned earlier, this test procedure detects data retention faults, and stuck-at-'1' faults in main memory cells (2) and redundant memory cells (4), but it does not detect stuck-at-'0' faults reliably, because no '1' read test is performed after ultraviolet erasure. Faults of types (1) and (3) may thus remain undetected, especially if they are due to unsuccessful fuse programming.

SUMMARY OF THE INVENTION

An object of the present invention is to provide a semiconductor memory device that can be inexpensively tested to detect both stuck-at-'0' faults and stuck-at-'1' faults after redundancy repair.

Another object of the invention is to provide an inexpensive test method for the invented semiconductor memory device.

The invented semiconductor memory device has a main cell array, a redundant cell array, a first selection circuit for selecting memory cells in the main cell array in response to external address input, and a second selection circuit, programmable with at least one redundancy repair address, for selecting memory cells in the redundant cell array when the external address input matches the redundancy repair address.

The memory device also has a readout circuit for reading the redundancy repair address from the second selection circuit, a spare cell array, and a third selection circuit for selecting memory cells in the spare cell array. The spare cell array is used for independent storage of each redundancy repair address programmed into the second selection circuit.

The memory device furthermore has a data output circuit for output of the data stored in the selected memory cells in the main cell array and redundant cell array, and for output of redundancy repair test data. These test data may simply be the redundancy repair addresses read by the readout circuit, and the redundancy repair addresses stored in the spare cell array. Alternatively, the test data may be comparison result data generated by comparing the redundancy repair addresses read by the readout circuit with corresponding redundancy repair address data stored in the spare cell array, the comparison being performed by a comparison circuit within the memory device.

The invented method of testing the invented semiconductor memory device includes the steps of storing a redundancy repair address in the spare cell array, programming the redundancy repair address into the second selection circuit, reading the redundancy repair address from the second selection circuit, reading the redundancy repair address from the spare cell array, and comparing the two redundancy repair addresses. The comparison may be performed inside or outside the memory device.

BRIEF DESCRIPTION OF THE DRAWINGS

In the attached drawings:

FIG. 9 is a flowchart illustrating a conventional method of testing the memory device in FIG. 8; and FIG. 10 is a flowchart illustrating another conventional method of testing the memory device in FIG. 8.

DETAILED DESCRIPTION OF THE INVENTION

Figure 1:
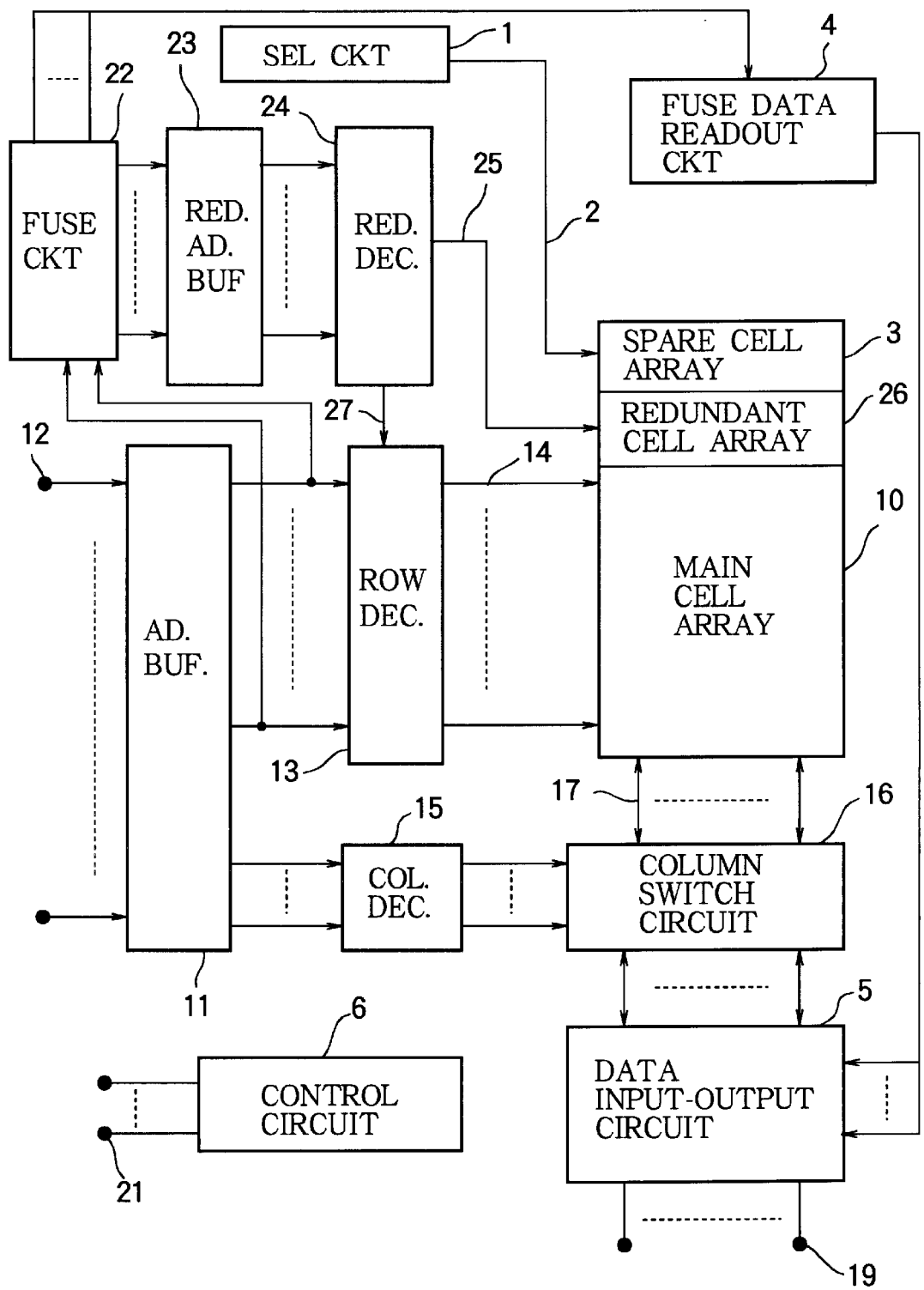
FIG. 1 is a block diagram of an electrically programmable read-only memory device embodying the present invention.

Embodiments of the invention will be described with reference to the attached drawings, in which like parts are indicated by like reference characters.

Figure 8:
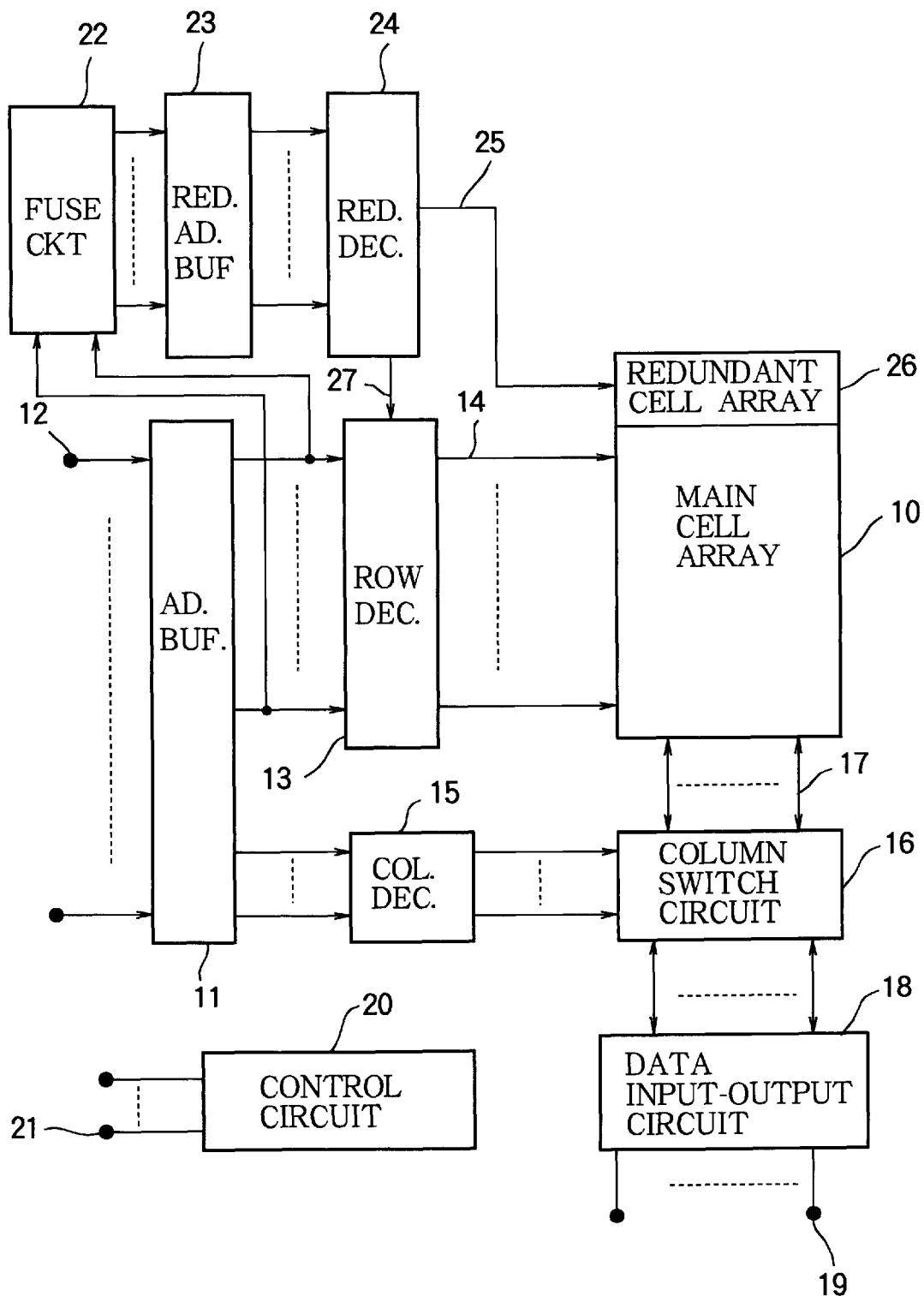
FIG. 8 is a block diagram of a conventional electrically programmable read-only memory device.

FIG. 1 shows a block diagram of an OTP ROM or EPROM device illustrating a first embodiment of the invention. The device comprises a spare cell selection circuit (SEL CKT) 1, at least one spare word line 2, a spare cell array 3, a fuse data readout circuit (CKT) 4, a data input-output circuit 5, and a control circuit 6. The device also has a main cell array 10, an address buffer (AD. BUF.) 11, a plurality of address input terminals 12, a row decoder (DEC.) 13, a plurality of word lines 14, a column (COL.) decoder 15, a column switch circuit 16, a plurality of bit lines 17, at least one data input-output terminal 19, a plurality of control signal input terminals 21, a redundancy fuse circuit 22, a redundant address buffer (RED. AD. BUF.) 23, a redundancy decoder (RED. DEC.) 24, at least one redundant word line 25, a redundant cell array 26, and a non-select signal line 27, which are similar to the corresponding elements in the conventional memory device in FIG. 8. The device in FIG. 1 is obtained from the conventional device in FIG. 8 by adding the spare cell selection circuit 1, spare word line(s) 2, spare cell array 3, and fuse data readout circuit 4, and replacing the data input-output circuit 18 and control circuit 20 in FIG. 8 with the data input-output circuit 5 and control circuit 6 in FIG. 1.

The spare cell array 3, main cell array 10, and redundant cell array 26 are arrays of nonvolatile memory cells (not visible) of the type described earlier, each comprising, for example, a field-effect transistor with a floating gate. A cell is programmed to the '0' state by injection of electrons into the floating gate, and erased to the '1' state by removal of electrons from the floating gate. The programming operation is carried out by applying predetermined voltages to the memory cell; the erasing operation is carried out by exposure to ultraviolet light. The memory cells in the spare cell array 3 will be referred to below as spare memory cells, or simply as spare cells.

A nonvolatile memory cell is selected for programming or read access by selecting the bit line 17 and the spare word line 2, word line 14, or redundant word line 25 to which the cell is connected. Only one spare word line 2, word line 14, or redundant word line 25 is selected at a time, but when bit lines 17 are selected, n bit lines are selected simultaneously, n being the number of data input-output terminals 19; that is, the data width. Programming and read access are carried out n bits at a time, as in the conventional memory device.

As input signals, the device receives external address signals at the address input terminals 12, input data signals at the data input-output terminals 19, and control signals at the control signal input terminals 21. The external address signals include row address signals and column address signals. As output signals, the device produces output data signals at the data input-output terminals 19.

The control circuit 6 controls the spare cell selection circuit 1, fuse data readout circuit 4, data input-output circuit 5, address buffer 11, row decoder 13, column switch circuit 16, and redundancy decoder 24 according to the control signals received at the control signal input terminals 21. The operations controlled in this way include programming the main memory cells, reading data from the main memory cells, programming the redundant memory cells (both before and after redundancy repair), reading data from the redundant memory cells (both before and after redundancy repair), programming redundancy repair address data into the spare memory cells, reading redundancy repair address data from the spare memory cells, and reading redundancy repair address data from the redundancy fuse circuit 22. The last of these operations will be referred to below as a roll call, and the redundancy repair address data read from the redundancy fuse circuit 22 will also be referred to as roll-call data.

The address buffer 11 generates internal row address data from the row address signals received at the address input terminals 12, and sends the internal row address data to the row decoder 13 and redundancy fuse circuit 22. The address buffer 11 also generates internal column address data from the column address signals received at the address input terminals 12, and sends the internal column address data to the column decoder 15.

The row decoder 13 decodes the internal row address data received from the address buffer 11 and thereby selects one word line 14 at a time. The column decoder 15 decodes the internal column address data received from the address buffer 11 and thereby selects n bit lines 17 at a time.

The data input-output circuit 5 sends input data received at the data input-output terminals 19 to the column switch circuit 16 to enable the data to be programmed into the spare cell array 3, main cell array 10, or redundant cell array 26. The data input-output circuit 5 also senses and amplifies data received from the column switch circuit 16, and outputs the amplified data at the data input-output terminals 19. The data received from the column switch circuit 16 may have been read from the spare cell array 3, main cell array 10, or redundant cell array 26. The data input-output circuit 5 also receives roll-call data from the fuse data readout circuit 4, and outputs the roll-call data at the data input-output terminals 19.

The column switch circuit 16 receives decoded column address signals from the column decoder 15. These signals control column switches that, in a read operation, connect sense amplifiers in the data input-output circuit 5 with the n selected bit lines 17. The column switch circuit 16 also includes a programming circuit that programs data received from the data input-output circuit 5 into the n selected memory cells, when the control circuit 6 designates a programming operation.

The address buffer 11, row decoder 13, column decoder 15, and column switch circuit 16 constitute a first selection circuit for selecting main memory cells.

The redundancy fuse circuit 22 has one or more fuse units, each fuse unit having one fuse per internal row address bit. The number of fuse units is equal to the number of redundant word lines 25, and thus to the number of word lines 14 that can be replaced if defective memory cells are found on them. Internal row address signals from the address buffer 11 pass through the fuses that have not been cut to the redundant address buffer 23. Before redundancy repair has been carried out, all of the internal row address signals pass through the redundancy fuse circuit 22 to the redundant address buffer 23.

The redundant address buffer 23 receives internal row address signals that pass through the redundancy fuse circuit 22, generates '1' data to replace internal row address signals that do not pass through the redundancy fuse circuit 22, and thereby generates what will be referred to below as redundant address data. The redundant address data are supplied to the redundancy decoder 24.

The redundancy decoder 24 decodes the redundant address data received from the redundant address buffer 23, selects the redundant word lines 25, and drives the non-select signal line 27. Normally, at most one redundant word line 25 is selected at a time. When any one of the redundant word lines 25 is selected, the non-select signal line 27 is driven to disable the row decoder 13, so that no word lines 14 are selected.

The address buffer 11, column decoder 15, column switch circuit 16, redundancy fuse circuit 22, redundant address buffer 23, and redundancy decoder 24 constitute a second selection circuit that can be programmed with redundancy repair addresses, and if so programmed, can select redundant memory cells in place of main memory cells when the external address received at the address input terminals 12 matches a redundancy repair address. The redundancy repair addresses are programmed into the redundancy fuse circuit 22, one address per fuse unit.

The redundant cell array 26 can also be accessed under control of the control circuit 6 even before redundancy repair. Responding to signals received at the control signal input terminals 21, the control circuit 6 generates internal control signals for selecting the redundant word lines 25, and sends these signals to the address buffer 11 and redundancy decoder 24. The redundancy decoder 24 selects a redundant word line 25 and sends a non-select signal on the non-select signal line 27 to disable the row decoder 13. A column address input at the address input terminals 12 selects n redundant memory cells on the selected redundant word line 25.

To access the spare memory cells, in response to a control signal received at the control signal input terminals 21, the control circuit 6 disables both the row decoder 13 and the redundancy decoder 24, activates the spare cell selection circuit 1, and sends the spare cell selection circuit signals for selecting the spare word lines 2. The spare cell selection circuit 1 selects one spare word line 2 according to the signals received from the control circuit 6. A column address input at the address input terminals 12 then selects n redundant memory cells on the selected spare word line 2.

The spare cell selection circuit 1, address buffer 11, column decoder 15, and column switch circuit 16 constitute a third selection circuit that selects spare memory cells.

In the roll-call operation, the control circuit 6 generates internal control signals that activate the fuse data readout circuit 4 and select a particular fuse unit in the redundancy fuse circuit 22, and sends these control signals to the fuse data readout circuit. The fuse data readout circuit 4 responds by reading redundancy repair address data from the selected fuse unit, and sending the redundancy repair address data as roll-call data to the data input-output circuit 5. The data input-output circuit 5 outputs the roll-call data at the data input-output terminals 19.

The column switch circuit 16 and data input-output circuit 5 constitute an output circuit for output of data stored in the main cell array 10, redundant cell array 26, and spare cell array 3, and for output of redundancy repair address data (roll-call data) read by the fuse data readout circuit 4 from the second selection circuit, more specifically from the redundancy fuse circuit 22.

The operations performed in the nonvolatile semiconductor memory device in FIG. 1 include programming the main memory cells, reading data from the main memory cells, programming the redundant memory cells (both before and after redundancy repair), reading data from the redundant memory cells (both before and after redundancy repair), programming redundancy repair address data into the spare memory cells, reading redundancy repair address data from the spare memory cells, programming redundancy repair addresses into the redundancy fuse circuit 22, and reading redundancy repair address data from the redundancy fuse circuit 22 (roll call). These operations will now be described with reference to FIGS. 2 to 5, which show examples of the internal structure of various blocks in FIG. 1.

FIGS. 2 to 5 show four word lines 14, one data input-output terminal 19, two redundant word lines 25, two spare word lines 2, and four bit lines 17, but needless to say, the invention is not restricted to these numbers of elements.

Figure 2:
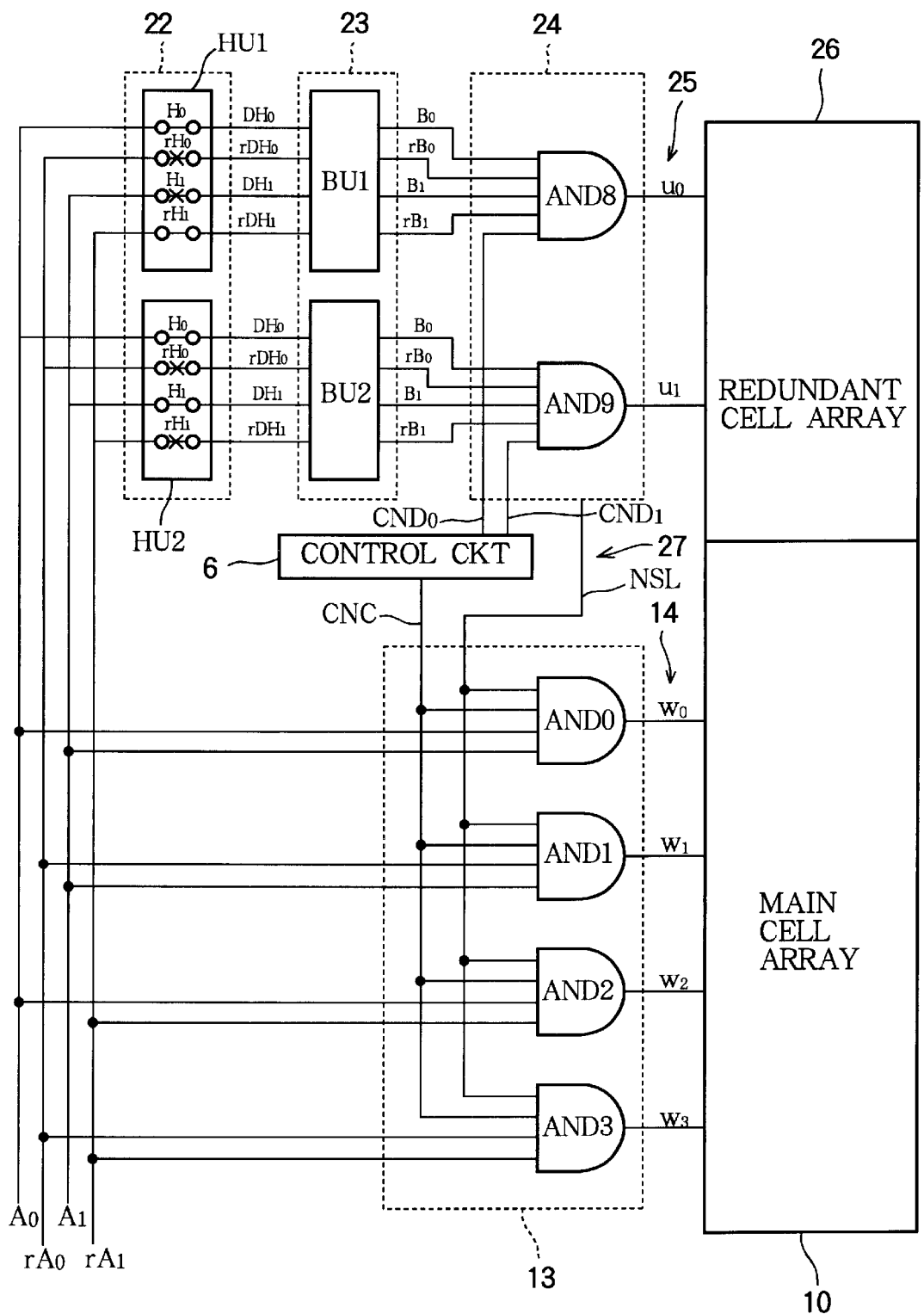
FIG. 2 is a more detailed block diagram showing the internal structure of the row decoder, redundancy fuse circuit, redundancy address buffer, and redundancy decoder in FIG. 1.

FIG. 2 shows an example of the internal structure of the row decoder 13, redundancy fuse circuit 22, redundant address buffer 23, and redundancy decoder 24. The row decoder 13 comprises AND gates AND0, AND1, AND2, AND3. The redundancy fuse circuit 22 comprises a pair of fuse units HU1, HU2. The redundant address buffer 23 comprises a pair of buffers BU1, BU2. The redundancy decoder 24 comprises a pair of AND gates AND8, AND9, and a NOR gate (not visible) that generates a non-select signal NSL from the outputs of the AND gates AND8, AND9.

Figure 3:
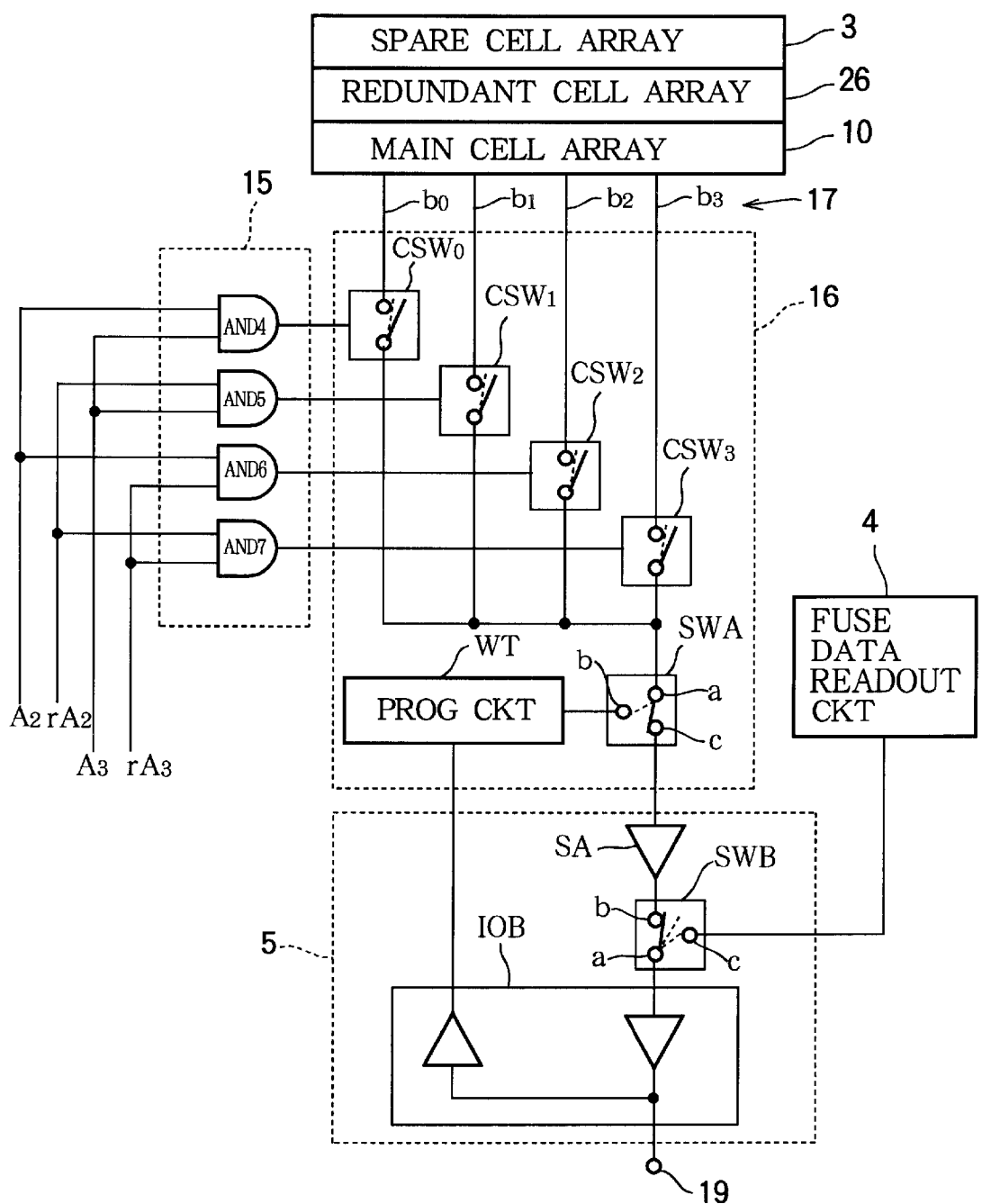
FIG. 3 is a more detailed block diagram showing the internal structure of the data input-output circuit, column decoder, and column switch circuit in FIG. 1.

FIG. 3 shows an example of the internal structure of the data input-output circuit 5, column decoder 15, and column switch circuit 16. The data input-output circuit 5 comprises a sense amplifier SA, an input-output buffer IOB, and a switch SWB. The column decoder 15 comprises AND gates AND4, AND5, AND6, AND7. The column switch circuit 16 comprises column switches $CSW_0$, $CSW_1$, $CSW_2$, $CSW_3$, a programming (PROG) circuit WT, and a switch SWA.

Figure 4:
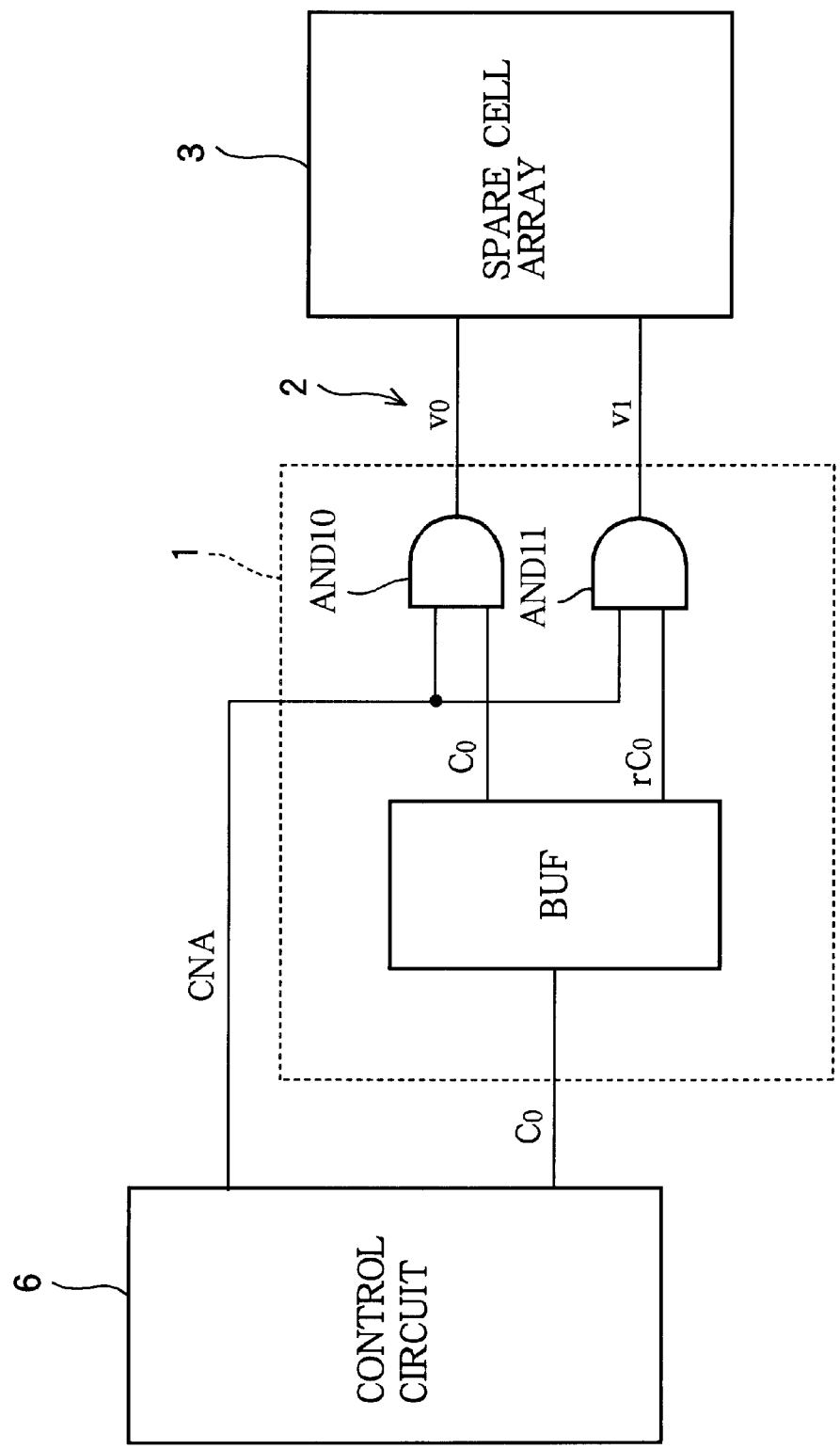
FIG. 4 is a more detailed block diagram showing the internal structure of the spare cell selection circuit in FIG. 1.

FIG. 4 shows an example of the internal structure of the spare cell selection circuit 1. The spare cell selection circuit 1 comprises a spare cell address buffer BUF, and a pair of AND gates AND10, AND11.

Figure 5:
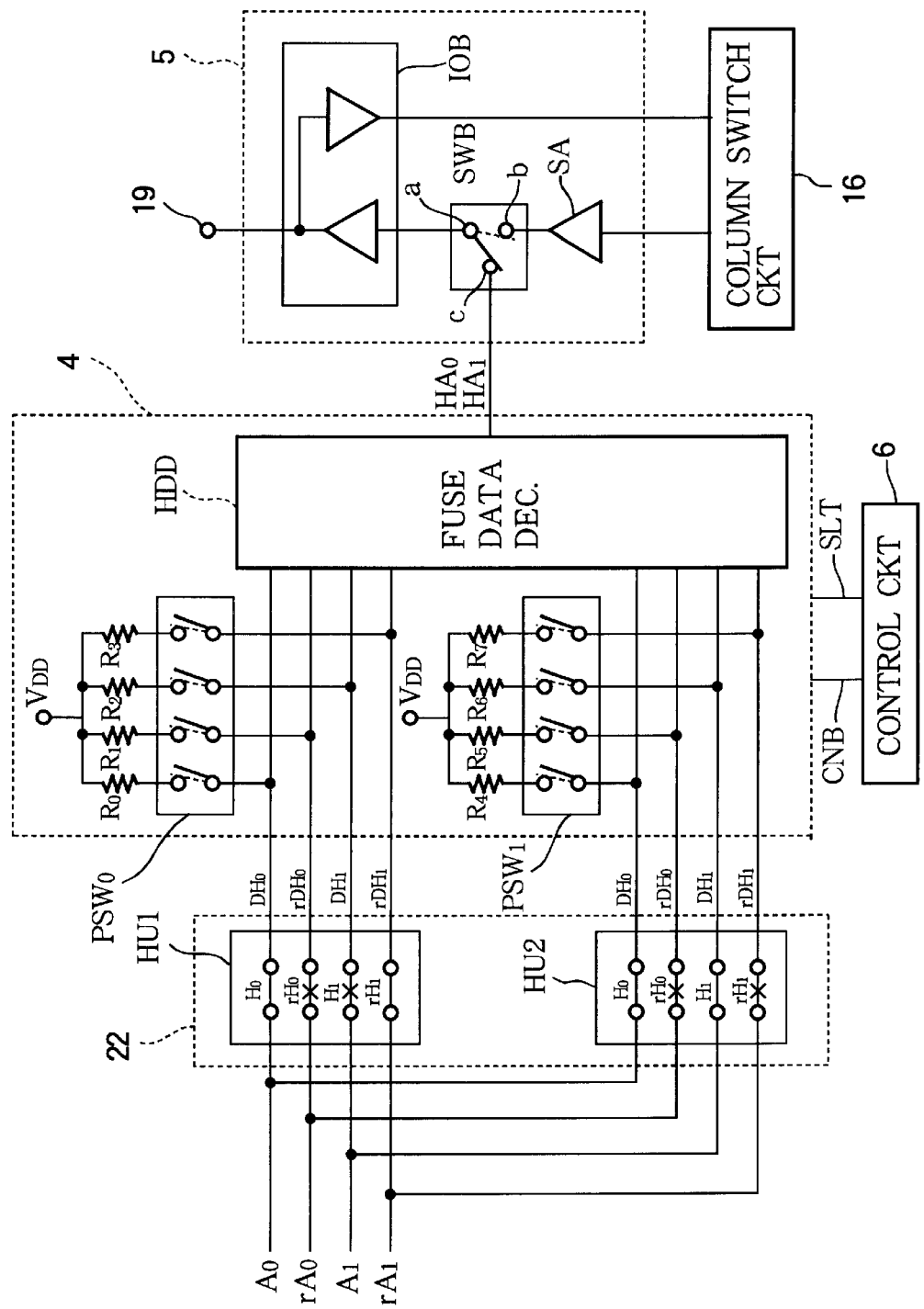
FIG. 5 is a more detailed block diagram showing the internal structure of the fuse data readout circuit, data input-output circuit, and redundancy fuse circuit in FIG. 1.

FIG. 5 shows an example of the internal structure of the fuse data readout circuit 4, together with the above-described structures of the data input-output circuit 5 and redundancy fuse circuit 22. The fuse data readout circuit 4 comprises pull-up resistances $R_0$, $R_1$, $R_2$, $R_3$, $R_4$, $R_5$, $R_6$, $R_7$, switches $PSW_0$, $PSW_1$, and a fuse data decoder (DEC.) HDD.

FIGS. 3 and 5 show the circuits necessary for one data input-output terminal 19; that is, for a one-bit data width (n=1). If the data width (n) is greater than one, then there are n times as many bit lines 17 and data input-output terminals 19 as shown, and the data input-output circuit 5 and column switch circuit 16 have n times as many switches, sense amplifiers, and input-output buffers as shown. In this case, the bit lines bo to $b_3$, column switches $CSW_0$ to $CSW_3$, switches SWA and SWB, sense amplifier SA, input-output buffer IOB, and data input-output terminal 19 should each be regarded as a representative one of n similar elements disposed for parallel transfer of n bits of data at a time. The programming circuit WT then has n input signal lines for receiving data from the n input-output buffers IOB, and n output signal lines for sending data to the n switches SWA, and the fuse data decoder HDD has n output signal lines for sending roll-call data to the n switches SWB.

As indicated in FIGS. 2, 4, and 5, the control circuit 6 generates the following internal control signals: $C_0$, which is supplied to the spare cell address buffer BUF in the spare cell selection circuit 1; CNA, which is supplied to the AND gates in the spare cell selection circuit 1; CNB, which activates the fuse data readout circuit 4; CNC, which is supplied to the AND gates in the row decoder 13; $CND_0$, which is supplied to AND gate AND8 in the redundancy decoder 24; $CND_1$, which is supplied to AND gate AND9 in the redundancy decoder 24; and a fuse unit selection control signal SLT, which selects the fuse data decoded in the fuse data readout circuit 4. The control circuit 6 also generates further internal control signals, not shown in the drawings, that control switches SWA and SWB and the address buffer 11.

For the structures shown in FIGS. 2 to 5, there are four external address bits $A_0$ to $A_3$, of which $A_0$ and $A_1$ are row address bits, and $A_2$ and $A_3$ are column address bits. From each of these address bits $A_i$ (i=0 to 3), the address buffer 11 generates two complementary internal address signals $A_i$ and $rA_i$. If the i-th external address signal received at an address input terminal 12 is at the low logic level ($A_i$='0'), then in the internal address signals output by the address buffer 11, $A_i$'0' and $rA_i$='1'. Conversely, if the i-th external address signal received at the address input terminal 12 is at the high logic level ($A_i$='1'), then in the internal address signals output by the address buffer 11, $A_i$='1' and $r_{Ai}$='0'. The internal row address signals $A_0$, $rA_0$, $A_1$, $rA_1$ are supplied to the row decoder 13 and redundancy fuse circuit 22. The internal column address signals $A_2$, $rA_2$, $A_3$, $rA_3$ are supplied to the column decoder 15.

The operations of programming and reading the memory cells in the main cell array 10 will now be described.

In read access or programming access to the main memory cells, the control circuit 6 sets control signal CNC to the high logic level and resets control signal CNA to the low logic level. If necessary, the control circuit 6 may also reset $CND_0$ and $CND_1$ to the low logic level, to ensure that the outputs of the AND gates in the redundancy decoder 24 are low, and thus that the non-select signal NSL is high.

Since CNC and NSL are both high, the AND gates in the row decoder 13 in FIG. 2 decode the internal row address signals. Specifically, AND0 decodes bits $A_0$ and $A_1$, AND1 decodes bits $rA_0$ and $A_1$, AND2 decodes bits $A_0$ and $rA_1$, and AND3 decodes bits $rA_0$ and $rA_1$. When input address signals $A_0$ and $A_1$ are both high, for example, the internal row address signals are $A_0$=$A_1$='1' and $rA_0$=$rA_1$='0,' so AND gate AND0 drives word line $w_0$ to the high level, while the other word lines $w_1$, $w_2$, $w_3$, remain low. That is, the row decoder 13 selects word line $w_0$. Similarly, the row decoder 13 selects word line $w_1$ when $A_0$='0' and $A_1$='1,' word line $w_2$ when $A_0$='1' and $A_1$='0,' and word line $w_3$ when $A_0$='0' and $A_1$='0.'

In like fashion, the AND gates in the column decoder 15 in FIG. 3 decode the internal column address signals. Specifically, AND4 decodes bits $A_2$ and $A_3$, AND5 decodes bits $rA_2$ and $A_3$, AND6 decodes bits $A_2$ and $rA_3$, and AND7 decodes bits $rA_2$ and $rA_3$.

The output of AND gate AND4 controls column switch $CSW_0$ in the column switch circuit 16. When the AND4 output is high, that is, when $A_2$=$A_3$='1,' column switch $CSW_0$ closes, connecting bit line $b_0$ to terminal 'a' of switch SWA. When the AND4 output is low, column switch $CSW_0$ opens, as shown, so that bit line $b_0$ is disconnected from switch SWA. Similarly, the output of AND gate AND5 controls column switch $CSW_1$, which connects bit line $b_1$ to terminal 'a;' the output of AND gate AND6 controls column switch $CSW_2$, which connects bit line $b_2$ to terminal 'a;' and the output of AND gate AND7 controls column switch $CSW_3$, which connects bit line $b_3$ to terminal 'a.'

In this way, the column decoder 15 and column switch circuit 16 select bit line $b_0$ when $A_2$=$A_3$='1,' bit line $b_1$ when $A_2$='0' and $A_3$='1,' bit line $b_2$ when $A_2$='1' and $A_3$='0,' and bit line $b_3$ when $A_2$='0' and $A_3$='0.'

If the data width n is equal to one, then one external address input leads to the selection of one word line 14 and one bit line 17, thus to the selection of one memory cell in the main cell array 10. If the data width n is greater than one, then one external address input selects n bit lines 17 and n memory cells.

In a programming operation, the control circuit 6 sets switch SWA in FIG. 3 so that terminal 'a' is coupled to terminal 'b,' which receives data from the programming circuit WT, and sets switch SWB so that terminal 'a' is disconnected from both terminals 'b' and 'c.' External data received at data input-output terminal 19 are transferred through the input-output buffer IOB in the data input-output circuit 5 to the programming circuit WT in the column switch circuit 16. The programming circuit WT drives the selected bit line through switch SWA and the selected column switch. For input data '0' the programming circuit WT applies a voltage that programs the selected memory cell to the '0' state. For input data '1' the programming circuit WT leaves the memory cell in the erased state or '1' state.

In a read access operation, the control circuit 6 sets switch SWA so that terminal 'a' is coupled to terminal 'c,' which is connected to the input terminal of the sense amplifier SA, and sets switch SWB so that terminal 'a,' which is connected to the input-output buffer IOB, is coupled to terminal 'b,' which is connected to the output terminal of the sense amplifier SA. Data read from a selected memory cell thus pass through switches SWA and SWB while being amplified by the sense amplifier SA, and are set in the input-output buffer IOB for output at the data input-output terminal 19.

If the data width n is greater than one, then n memory cells at a time are programmed or read as described above.

Next, the redundancy repair operation will be described. Each fuse unit HU1, HU2 in the redundancy fuse circuit 22 in FIG. 2 can store one redundancy repair address, so a maximum of two word lines 14 with defective memory cells in the main cell array 10 can be replaced by redundant word lines 25. Each fuse unit HU1, HU2 comprises four fuses $H_0$, $rH_0$, $H_1$, $rH_1$, each of which is, for example, a conductive polycrystalline silicon line that can be cut by laser illumination.

In fuse unit HU1, fuse Ho is positioned on the signal line that carries internal row address bit $A_0$ from the address buffer 11 to the first buffer BU1 in the redundant address buffer 23. Fuses $rH_0$, $H_1$, $rH_1$ are positioned on similar signal lines carrying internal row address bits $rA_0$, $A_1$, $rA_1$, respectively, to buffer BU1. Fuse unit HU2 has the same structure, but the four fuses $H_0$, $rH_0$, $H_1$, $rH_1$ are positioned on signal lines that carry the same internal row address signals $A_0$, $rA_0$, $A_1$, $rA_1$, to the second buffer BU2.

If, for example, a defective memory cell is found in the main cell array 10 at row address $A_0$='1,' $A_1$='0,' it can be replaced by cutting fuses $rH_0$ and $H_1$ in fuse unit HU1, as shown, thereby programming $A_0$='1,' $A_1$'0' into the redundancy fuse circuit 22 as a redundancy repair address. If another defective memory cell is found in the main cell array 10 at row address $A_0$='1,' $A_1$='1,' it can be replaced by cutting fuses $rH_0$ and $rH_1$ in fuse unit HU2, also as shown, thereby storing $A_0$='1,' $A_1$'1' as a redundancy repair address. These two operations replace all the main memory cells on word line $w_2$ with corresponding redundant memory cells on redundant word line $u_0$, and all the main memory cells on word line $w_0$ with corresponding redundant memory cells on redundant word line $u_1$.

After these redundancy repairs, programming and read access to the redundant cell array 26 is performed as follows.

First, a brief description of the operation of the redundant address buffer 23 will be given. Each buffer BU1, BU2 generates four redundant address bits $B_0$, $rB_0$, $B_1$, $rB_1$. Each of these bits has the same value as the corresponding internal row address bit $A_0$, $rA_0$, $A_1$, $rA_1$ if the corresponding fuse $H_0$, $rH_0$, $H_1$, $rH_1$ is intact in the redundancy fuse circuit 22. If the fuse has been cut, then the redundant address bit is pulled up to '1' by an internal pull-up resistor (not visible) in the buffer. After the above-described redundancy repair, the first buffer BU1 generates redundant address bits $B_0$=$A_0$, $rB_0$='1,' $B_1$='1,' $rB_1$=$rA_1$, while the second buffer BU2 generates redundant address bits $B_0$=$A_0$, $rB_0$='1,' $B_1$=$A_1$, $rB_1$='1.'

To enable access to the redundant cell array 26 after redundancy repair, the control circuit 6 sets control signals $CND_0$ and $CND_1$ to the '1' level to enable the redundancy decoder 24. If row address $A_0$='1,' $A_1$'0' is input at the address input terminals 12, then since $A_0$ and $rA_1$ are both '1,' all of the redundant address bits $B_0$, $rB_0$, $B_1$, $rB_1$ output by buffer BU1 are '1.' Accordingly, all inputs to AND gate AND8 are '1' and redundant word line $u_0$ is driven to the '1' level. That is, redundant word line $u_0$ is selected. Since the output of AND gate AND8 is high, the non-select signal NSL is low, disabling the row decoder 13, so none of the regular word lines 14 are selected. The column address bits thus select a redundant memory cell (or n redundant memory cells) on redundant word line $u_0$ without selecting any main memory cells. The selected redundant memory cell(s) are read or programmed in the same way as main memory cells.

If any row address other than $A_0$='1,' $A_1$'0' is input at the address input terminals 12, then one of the two redundant address bits $B_0$, $rB_1$ output by buffer BU1 will be '0' (because $A_0$='0' or $A_1$='1'), so the output of AND gate AND8 will be '1' and redundant word line $u_0$ will not be selected.

Similarly, if row address $A_0$='1,' $A_1$'1' is input at the address input terminals 12, buffer BU2 generates all '1' redundant address bits $B_0$, $rB_0$, $B_1$, $rB_1$, and AND gate AND9 drives redundant word line $u_1$ to the '1' level. The redundant memory cell (or n redundant memory cells) selected by the column address bits on redundant word line $u_1$ are then read or programmed. If any row address other than $A_0$='1,' $A_1$='1' is input at the address input terminals 12, then one of the two redundant address bits $B_0$, $B_1$ is '0' (because $A_0$ or $A_1$ is '0'), so the output of AND gate AND9 is '0' and redundant word line ul is not selected.

To test the redundant memory cells before (or after) redundancy repair is performed, the redundant cell array 26 can be accessed as follows. From the control signal input terminals 21, the control circuit 6 receives control signals specifying access to the redundant cell array 26 and selecting one of the redundant word lines 25. In response, the control circuit 6 sets control signal CNC to the '0' level, disabling the row decoder 13, and controls the address buffer 11 so that all of the internal row address signals $A_0$, $rA_0$, $A_1$, $rA_1$ are driven to the '1' level. All outputs of the redundant address buffer 23 are '1,' and the AND gates AND8, AND9 are controlled by control signals $CND_0$, $CND_1$.

To access redundant memory cells on redundant word line $u_0$, the control circuit 6 sets $CND_0$ to '1' and $CND_1$ to '0.' The output of AND gate AND8 goes to the '1' level, while the output of AND gate AND9 is at the '0' level. Redundant memory cells on redundant word line $u_0$ are then selected by column address signals $A_2$, $A_3$ received at the address input terminals 12. The selected memory cells can be programmed or read through the data input-output circuit 5 and column switch circuit 16.

Similarly, to access redundant memory cells on redundant word line $u_1$, the control circuit 6 sets $CND_0$ to '0' and $CND_1$ to '1.' The output of AND gate AND8 goes to the '0' level, while the output of AND gate AND9 goes to the '1' level. Redundant memory cells on redundant word line $u_1$, selected by the column address signals $A_2$, $A_3$, can then be programmed or read.

Access to the spare cell array 3 will now be described. This operation can be used to program redundancy repair address data into selected spare memory cells for storage therein, or to read the stored data. The operation is initiated by control signals received at the control signal input terminals 21, which also select one of the spare word lines 2. The control signals are accompanied by column address input at the address input terminals 12, and for a programming operation, by input of redundancy repair address data at the data input-output terminals 19. The redundancy repair address data specify the row address ($A_0$, $A_1$) of a defective main memory cell. The redundancy repair address data stored in the spare cell array 3 will be denoted $MA_0$, $MA_1$.

The control circuit 6 responds to the control signal input by setting internal control signal CNA to the '1' level, thereby enabling the spare cell selection circuit 1, resetting internal control signals CNC, $CND_0$, $CND_1$ to the '0' level, thereby disabling the row decoder 13 and redundancy decoder 24, and generating internal control signal $C_0$. Internal control signal $C_0$ selects one of the spare word lines 2, as directed by the external control signal input.

To access spare memory cells on spare word line $v_0$, the control circuit 6 sets $C_0$ to '1.' The buffer BUF in the spare cell selection circuit 1 outputs this signal $C_0$ and a complementary signal $rC_0$ as internal spare row address signals. AND gate AND10 receives $C_0$ and CNA (both '1') and drives spare word line $v_0$ to the '1' level. Spare memory cells on redundant word line $v_0$ are then selected by the column address bits $A_2$, $A_3$ received at the address input terminals 12. The selected spare memory cells can be programmed or read through the data input-output circuit 5 and column switch circuit 16.

Similarly, to access spare memory cells on spare word line $v_1$, the control circuit 6 sets $C_0$ to '0.' The buffer BUF outputs the complementary spare address signal $rC_0$ to AND gate AND11, which also receives CNA. Since both $rC_0$ and CNA are '1,' AND gate AND11 drives spare word line $v_1$ to the '1' level. Spare memory cells on redundant word line $v_1$, selected by the column address bits $A_2$, $A_3$, can then be programmed or read.

Depending on the data width n, the redundancy repair address data can be stored in the spare cell array 3 in various ways. If n is equal to one, then each bit of redundancy repair address data must be stored separately. If n is equal to or greater than two, however, then the two bits of redundancy repair address data $MA_0$, $MA_1$ for fuse unit HU1 can be stored simultaneously in two spare memory cells when, for example, spare word line $v_0$ and bit line $b_0$ are selected, and the two bits of redundancy repair address data $MA_0$, $MA_1$ for fuse unit HU2 can be stored simultaneously in two different spare memory cells when, for example, spare word line $v_1$ and bit line $b_0$ are selected. Alternatively, the two bits $MA_0$, $MA_1$ for fuse unit HU1 can be stored when spare word line $v_0$ and bit line $b_0$ are selected, and the two bits $MA_0$, $MA_1$ for fuse unit HU2 can be stored when spare word line $v_0$ and bit line spare $b_1$ are selected. If the data width n is equal to or greater than four, then the redundancy repair address data $MA_0$, $MA_1$ for both fuse units HU1, HU2 can be stored simultaneously when, for example, spare word line $v_0$ and bit line $b_0$ are selected.

Next, the roll-call operation will be described. To distinguish the roll-call data read from the redundancy fuse circuit 22 from the redundancy repair address data stored in the spare cell array 3, the roll-call data will be denoted $HA_0$, $HA_1$.

The roll-call operation is initiated by control signals received at the control signal input terminals 21, which also designate one of the fuse units HU1, HU2. The control circuit 6 responds by setting internal control signal CNB to the '1' level to enable the fuse data readout circuit 4, and setting the fuse unit selection control signal SLT to the '0' or '1' level to select the designated fuse unit. CNB and SLT are sent to the fuse data readout circuit 4. The control circuit 6 also controls the address buffer 11 so as to reset all four internal row address signals $A_0$, $rA_0$, $A_1$, $rA_1$ to the '0' level, and sets switch SWB so that terminal 'a' is coupled to terminal 'c,' as depicted in FIG. 5.

When the redundancy repair address data stored in fuse unit HU1 are read, switch $PSW_0$ is closed so that the signal lines leading from fuse unit HU1 in the redundancy fuse circuit 22 to the fuse unit decoder HDD in the fuse data readout circuit 4 are pulled up to the '1' level (denoted $V_{DD}$ in FIG. 5) through resistances $R_0$, $R_1$, $R_2$, $R_3$. Since all of the internal row address signals $A_0$, $rA_0$, $A_1$, $rA_1$ are at the '0' level, the data $DH_0$, $rDH_0$, $DH_1$, $rDH_1$ supplied from fuse unit HU1 to the fuse unit decoder HDD are at the '0' level if the corresponding fuse is intact, and at the '1' level if the fuse has been cut. In the example shown in FIG. 5, $DH_0$=$rDH_1$='0' and $rDH_0$=$DH_1$='1.'

The fuse unit decoder HDD sets $HA_0$ to the '1' level if $DH_0$='0' and $rDH_0$='1,' and resets $HA_0$ to the '0' level if $DH_0$='1' and $rDH_0$='0.' Similarly, $HA_1$ is set to the '1' level if $DH_1$='0' and $rDH_1$='1,' and is reset to the '0' level if $DH_1$='1' and $rDH_1$='0.' In the example shown, the fuse data decoder HDD decodes the redundancy repair address programmed into fuse data fuse unit HU1 to obtain roll-call data in which $HA_0$='1' and $HA_1$='0.' These two bits are sent from the fuse data decoder HDD to terminal 'c' of switch SWB and are thus supplied to the input-output buffer IOB in the data input-output circuit 5, which outputs them at the data input-output terminal 19. If the data width n is equal to or greater than two, then both bits $HA_0$ and $HA_1$ can be output simultaneously.

The redundancy repair address data stored in fuse unit HU2 are read in the same way. The control circuit 6 sets the fuse unit selection control signal SLT to select fuse unit HU2, more specifically, to close switch $PSW_1$ and have the fuse data decoder HDD decode the data $DH_0$, $rDH_0$, $DH_1$, $rDH_1$ supplied from fuse unit HU2. In the example shown, $DH_0$=$DH_1$='0' and $rDH_0$=$rDH_1$='1,' so both bits of decoded roll-call data $HA_0$ and $HA_1$ are set to the '1' level.

Figure 6:
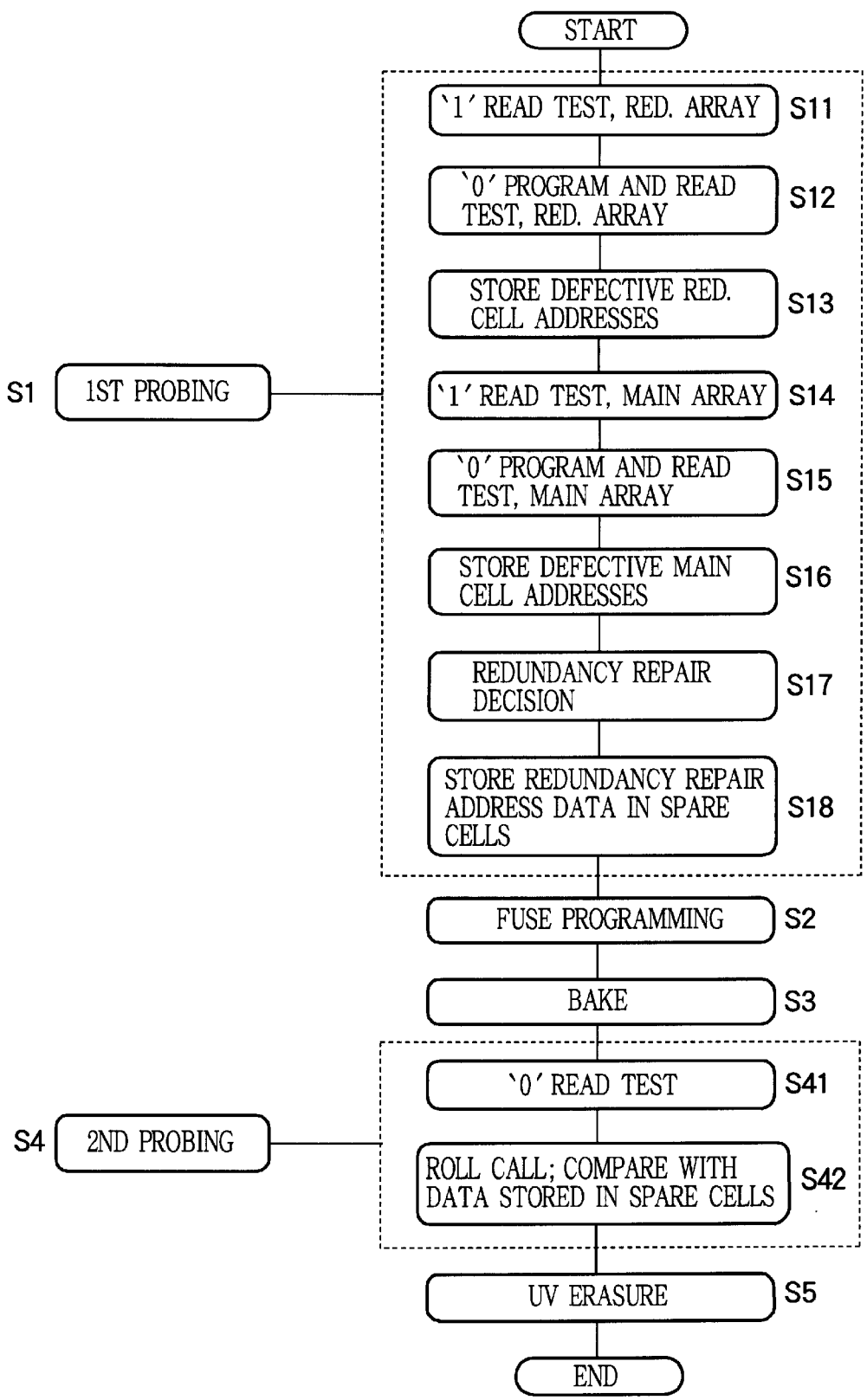
FIG. 6 is a flowchart illustrating the invented test method.

FIG. 6 shows the test procedure followed in the first embodiment. The procedure comprises a first probing step S1, a fuse-programming step S2, a baking step S3, a second probing step S4, and an ultraviolet erasing step S5. The first probing step S1 includes sub-steps S11 to S18. The second probing step S4 includes a sub-steps S41 and S42. This procedure is essentially the same as the conventional test procedure shown in FIG. 10, with the addition of sub-steps S18 and S42. Like the conventional procedure, the procedure in FIG. 6 is normally carried out on a wafer on which a plurality of memory devices have been formed. The apparatus that executes the two probing steps S1, S2 will again be referred to as a tester.

At the beginning of the test procedure, all memory cells in the spare cell array 3, main cell array 10, and redundant cell array 26 are nominally in the '1' state, and no fuses have been cut yet in the redundancy fuse circuit 22.

The first probing step S1 begins with a '1' read test of all redundant memory cells (sub-step S11). Next, all redundant memory cells are programmed to '0' and a '0' read test is performed (sub-step S12). The addresses of any defective redundant memory cells found in these tests are stored in the tester (sub-step S13).

The first probing step continues with a '1' read test of all main memory cells (sub-step S14). Next, all main memory cells are programmed to '0' and a '0' read test is performed (sub-step S15). The addresses of any defective main memory cells found in these tests are stored in the tester (sub-step S16).

From the stored addresses of the defective redundant cells and main cells, the tester determines whether any main cells are defective, and if so, whether all defective main cells be replaced with non-defective redundant cells. That is, the tester decides whether redundancy repair is necessary and feasible (sub-step S17). If it is, the tester decides which redundant word lines 25 will replace which word lines 14, and writes the appropriate redundancy repair address data in the spare cell array 3, storing two bits $MA_0$, $MA_1$ for each redundancy repair row address $A_0$, $A_1$. The data stored in the spare cell array 3 are preferably also read, to confirm that they have been stored correctly. (Incorrect data storage may occur due to a defective spare memory cell.) This completes the first probing step S1.

If redundancy repair is necessary and feasible, the redundancy fuse circuit 22 is programmed by cutting fuses in step S2. For each redundancy repair address, half of the fuses $H_0$, $rH_0$, $H_1$, $rH_1$ in the relevant fuse unit HU1 or HU2 are cut. More specifically, one fuse in each complementary pair is cut: either $H_0$ or $rH_0$ is cut, and either $H_1$ or $rH_1$ is cut. As explained above, cutting these fuses causes the corresponding redundant word line 25 to be selected in place of the replaced word line 14. At the end of this step, all non-defective main memory cells and all non-defective redundant memory cells have been programmed to '0,' so all-zero data should be readable from all addresses.

In step S3, the wafer is baked to accelerate leakage of programmed data from faulty memory cells, more specifically, to accelerate the leakage of electrons from the floating gates of such memory cells.

In the second probing step S4, first, data retention is tested by performing a '0' read test (sub-step S41). All memory addresses are read. The tested memory cells are main memory cells in the main cell array 10 at row addresses not matching redundancy repair addresses, and redundant memory cells in the redundant cell array 26 for other row addresses.

Next, for memory devices that did not have non-repairable defects, as determined in sub-step S17, and that passed the '0' read test in sub-step S41, the tester reads the redundancy repair address data $HA_0$, $HA_1$ programmed into the redundancy fuse circuit 22 for each redundancy repair row address $A_0$, $A_1$, reads the corresponding redundancy repair address data $MA_0$, $MA_1$ stored in the spare cell array 3, and verifies that $HA_0$, $HA_1$ and $MA_0$, $MA_1$ match. This test detects almost all fuse-programming errors, because if a fuse is incompletely cut or incorrectly cut, making the $HA_0$, $HA_1$ values incorrect, the probability that the spare cell array 3 will have a defect that produces exactly the same incorrect $MA_0$, $MA_1$ data is very low.

Finally, the wafer is exposed to ultraviolet light to erase all data to '1' in step S5.

As noted earlier, aside from data retention faults, a memory device may have four types of faults: (1) a main memory cell that cannot be erased to '1' and has not been replaced by a redundant memory cell; (2) a main memory cell that cannot be programmed to '0' and has not been replaced by a redundant memory cell; (3) a main memory cell that has been replaced by a redundant memory cell that cannot be erased to '1;' (4) a main memory cell that has been replaced by a redundant memory cell that cannot be programmed to '0.'

Almost all faults of types (1) and (2) are due to unsuccessful fuse programming, and are detected by the test performed in sub-step S42, which compares the roll-call data $HA_0$, $HA_1$ with the redundancy repair address data $MA_0$, $MA_1$ stored in the spare cell array 3. This test also detects most faults of types (3) and (4), because most of these faults also turn out to be due to fuse programming errors.

In addition, all faults of types (2) and (4) are detected by the '0' read test performed in sub-step S41. The main type of fault that is not detected is a fault of type (3) that is not due to a fuse programming error; that is, a redundant memory cell that initially read '1' in sub-step S11 of the first probing step S1, but cannot be erased to '1' after being programmed to '0' in sub-step S12. This type of fault is rare.

The first embodiment thus makes possible a test procedure that detects almost all faults with just two wafer probing steps. A particular advantage of this procedure is that since the redundancy repair address data are stored in the memory device itself, in the spare cell array 3, these data do not have to be retained in the tester while the memory device is being fuse-programmed in step S2 and baked in step S3.

Figure 7:
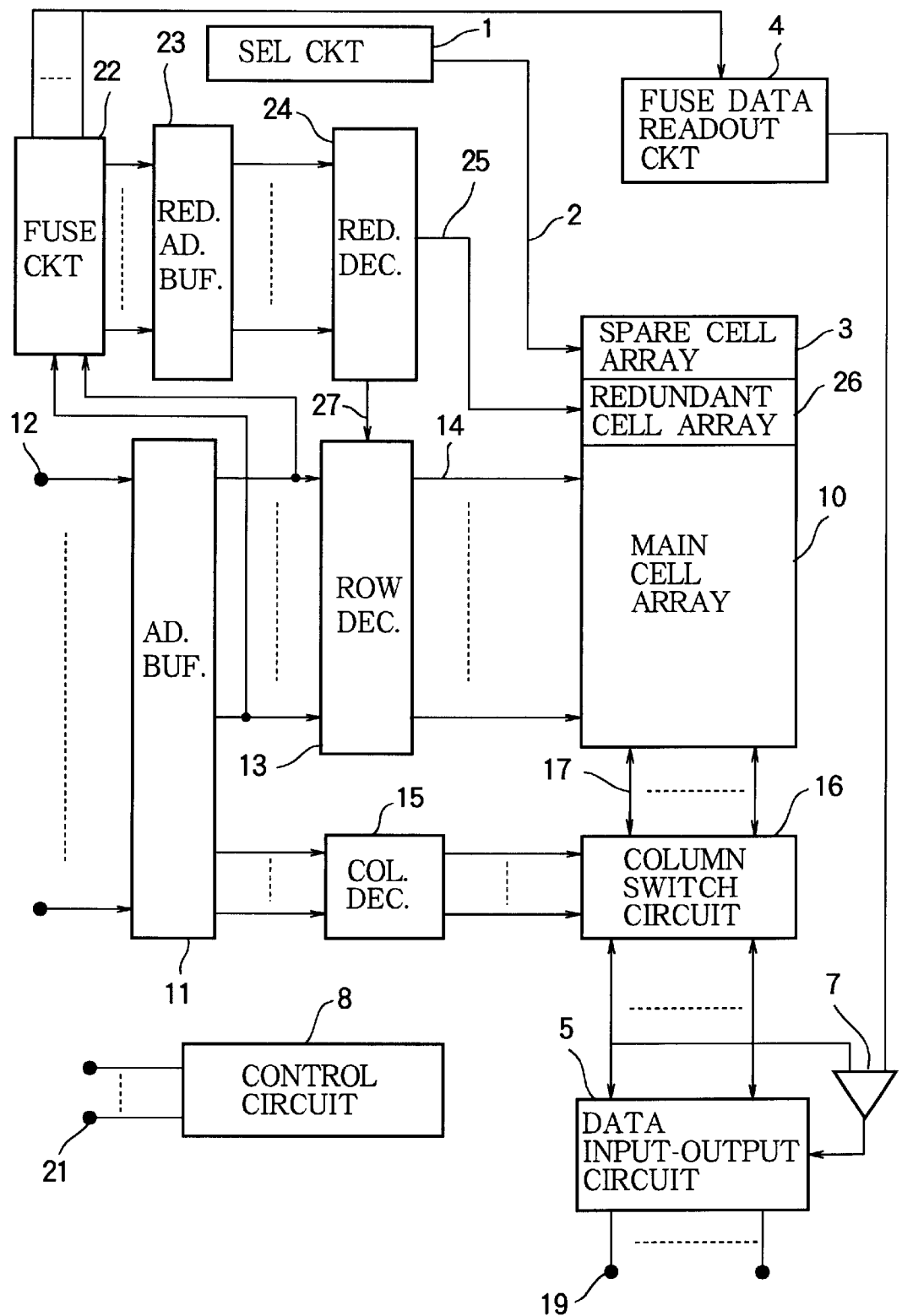
FIG. 7 is a block diagram of another electrically programmable read-only memory device embodying the invention.

As a second embodiment of the invention, FIG. 7 shows a nonvolatile semiconductor memory (OTP ROM or EPROM) that adds a comparison circuit 7 to the structure of the first embodiment. The comparison circuit 7 receives roll-call data $HA_0$, $HA_1$ from the fuse data readout circuit 4 and redundancy repair address data $MA_0$, $MA_1$ from the column switch circuit 16. The redundancy repair address data $MA_0$, $MA_1$ have been read from the spare cell array 3. The comparison circuit 7 has one or more sense amplifiers (not visible) for sensing and amplifying the redundancy repair address data $MA_0$, $MA_1$, and comparison circuitry (not visible) for comparing the amplified data $MA_0$, $MA_1$ with the roll-call data $HA_0$, $HA_1$. Comparison result data are sent from the comparison circuitry to the data input-output circuit 5 for output at the data input-output terminals 19. The comparison circuit 7 is coupled to terminal 'c' of switch SWB in FIGS. 3 and 5.

The control circuit 8 in FIG. 7 controls the fuse data readout circuit 4, data input-output circuit 5, comparison circuit 7, address buffer 11, row decoder 13, column switch circuit 16, and redundancy decoder 24 according to external control signals received at the control signal input terminals 21.

The other elements in FIG. 7 are similar to the corresponding elements in FIG. 1.

Like the first embodiment, the second embodiment performs operations of programming the main memory cells, reading data from the main memory cells, programming the redundant memory cells (both before and after redundancy repair), reading data from the redundant memory cells (both before and after redundancy repair), storing redundancy repair address data in the spare memory cells, and programming redundancy repair addresses into the redundancy fuse circuit 22. In addition, the second embodiment performs an operation of reading redundancy repair address data from the spare memory cells and redundancy repair address data (roll-call data) from the redundancy fuse circuit 22 into the comparison circuit 7, comparing these data in the comparison circuit 7 as described above, and outputting comparison result data. All of these operations are controlled by the control circuit 8.

The operation of comparing redundancy repair address data and roll-call data is initiated by control signals received at the control signal input terminals 21, accompanied as necessary by column addresses received at the address input terminals 12. The control circuit 8 disables the row decoder 13 and redundancy decoder 24, enables the spare cell selection circuit 1 and fuse data readout circuit 4, and sets switch SWB in the data input-output circuit 5 to connect the comparison circuit 7 to the input-output buffer BUF. The spare cell selection circuit 1 and column switch circuit 16 select n spare memory cells at a time, from which redundancy repair address data $MA_0$, $MA_1$ are read and sent to the comparison circuit 7. The fuse data readout circuit 4 reads corresponding roll-call data $HA_0$, $HA_1$ from the redundancy fuse circuit 22, and sends the roll-call data to the comparison circuit 7. The redundancy repair address data $MA_0$, $MA_1$ and roll-call data $HA_0$, $HA_1$ can be read simultaneously, thereby saving time. The comparison circuit 7 compares $MA_0$, $MA_1$ with $HA_0$, $HA_1$, generates comparison result data, and sends the comparison result data to the data input-output circuit 5. The data input-output circuit 5 outputs the comparison result data as test data at the data input-output terminals 19.

The test method for the second embodiment follows the same flowchart (FIG. 6) as in the first embodiment, with the following modification to sub-step S42 of the second probing step S2.

In sub-step S42 in the first embodiment, the roll-call data $HA_0$, $HA_1$ and the redundancy repair address data $MA_0$, $MA_1$ had to be read separately, had to be transferred separately to the tester, and then had to be compared within the tester, for each redundancy repair address.

In sub-step S42 in the second embodiment, the roll-call data $HA_0$, $HA_1$ and the redundancy repair address data $MA_0$, $MA_1$ are compared by the comparison circuit 7 within the memory device under test, and the tester only has to read the comparison result data. The amount of data output from the memory device to the tester in sub-step S42 is reduced by at least a factor of two, and the test time is shortened accordingly.

The control circuit 8 in the second embodiment preferably also controls the spare cell selection circuit 1 and data input-output circuit 5 for output of the redundancy repair address data from the spare cell array 3 during the first probing step S1, after these data have been programmed into the spare cell array 3 but before they have been programmed into the redundancy fuse circuit 22, to verify that the redundancy repair address data have been stored correctly in the spare cell array 3.

In the preceding description, the spare cell array 3 stored one redundancy repair address bit for each external row address bit in each redundancy repair address, but other storage schemes are possible. For example, the spare cell array 3 may store one bit for each fuse in the redundancy fuse circuit 22, thus storing two bits of redundancy repair address data (fuse data) per external row address bit. The fuse data decoder HDD in the fuse data readout circuit 4 can then be altered to a fuse data selector that selects n bits of fuse data at a time for transmission to the data input-output circuit 5 or comparison circuit 7. Alternatively, the spare cell array 3 may store the redundancy repair address data $MA_0$, $MA_1$ described above and additional flag bits to indicate which redundant word lines 25 have been assigned for redundancy repair, and the fuse data decoder HDD may generate similar, flag data, in addition to the roll-call data $HA_0$, $HA_1$ described above. The fuse data decoder HDD may also generate error flag data to indicate that both fuses in a complementary pair (for example, both fuses $H_0$ and $rH_0$ in the same fuse unit) have been cut, a fault that causes the same redundant memory cells to replace main memory cells at two different row addresses.

In the second embodiment, the comparison circuit 7 may output comparison result data in various forms, such as one result bit per redundancy repair address bit, one result bit per fuse unit, or one result bit for all fuse units in the redundancy fuse circuit 22. These types of output can be obtained by providing the comparison circuit 7 with appropriate logic circuits, bit accumulators, and the like.

The invention has been described in relation to an OTP ROM or EPROM, but can be practiced in any type of semiconductor memory device in which redundancy repair is performed, by providing a suitable spare cell array, means for selecting, programming, and reading the spare memory cells, and means for reading roll-call data from the circuit that selects the redundant memory cells.

The invention can also be practiced in, for example, a microcontroller with embedded semiconductor memory having redundant memory cells.

Those skilled in the art will recognize that further variations are possible within the scope claimed below.

What is claimed is:

1. A semiconductor memory device, comprising:
   a main cell array having main memory cells for storing data;
   a redundant cell array having redundant memory cells for storing data in place of defective main memory cells in the main cell array;
   a first selection circuit coupled to the main cell array, for selecting the main memory cells in response to external address input;
   a second selection circuit coupled to the redundant cell array and programmable with at least one redundancy repair address, for selecting the redundant memory cells when the external address input matches the redundancy repair address;
   a readout circuit coupled to the second selection circuit, for reading the redundancy repair address from the second selection circuit;
   a spare cell array having spare memory cells for storing the redundancy repair address;
   a third selection circuit coupled to the spare cell array, for selecting the spare memory cells; and
   a data output circuit coupled to the main cell array, the redundant cell array, and the spare cell array, for output of the data stored in the selected main memory cells and the selected redundant memory cells, and for output of test data responsive to the redundancy repair address read by the readout circuit and the redundancy repair address stored in the spare cell array.

2. The semiconductor memory device of claim 1, wherein the data output circuit outputs the redundancy repair address read by the readout circuit and the redundancy repair address stored in the spare cell array separately as said test data.

3. The semiconductor memory device of claim 1, further comprising a comparison circuit coupled to the data output circuit, for comparing the redundancy repair address read by the readout circuit with the redundancy repair address stored in the spare cell array and generating comparison result data for output as said test data.

4. The semiconductor memory device of claim 3, wherein the data output circuit also outputs the redundancy repair address stored in the spare cell array.

5. A method of testing the semiconductor memory device of claim 3, comprising the steps of:

storing the redundancy repair address in the spare cell array;

programming the redundancy repair address into the second selection circuit;

activating the readout circuit and the comparison circuit to compare the redundancy repair address stored in the spare cell array with the redundancy repair address read from the second selection circuit and to generate the test data; and deciding, from the test data, whether a redundancy repair error has occurred.

6. A method of testing the semiconductor memory device of claim 1, comprising the steps of:

storing the redundancy repair address in the spare cell array;

programming the redundancy repair address into the second selection circuit;

using the readout circuit to read the redundancy repair address from the second selection circuit;

reading the redundancy repair address from the spare cell array; and comparing the redundancy repair address read from the spare cell array with the redundancy repair address read from the second selection circuit.

7. The method of claim 6, wherein said step of comparing is carried out within the semiconductor memory device.

8. The method of claim 6, wherein said step of storing is carried out before said step of programming.

* * * * *